United States Patent [19]

Churchill et al.

[11] Patent Number: 5,040,096
[45] Date of Patent: Aug. 13, 1991

[54] HIGH FORCE CLIP

[75] Inventors: Jack Churchill; Jeffrey J. Panek; Robert D. King, all of Laconia, N.H.

[73] Assignee: Aavid Engineering, Inc., Laconia, N.H.

[21] Appl. No.: 534,742

[22] Filed: Jun. 7, 1990

[51] Int. Cl.⁵ .............................................. H05K 7/20
[52] U.S. Cl. ................................... 361/386; 165/80.3; 357/79; 357/81; 361/388
[58] Field of Search ................. 165/80.3, 185; 174/16.3; 357/81, 79; 361/386, 388, 389

[56] References Cited

U.S. PATENT DOCUMENTS 4,408,220 10/1983 Calabro ........................... 174/16.3
4,552,206 12/1985 Johnson et al. ..................... 357/81

Primary Examiner—Gregory D. Thompson
Attorney, Agent, or Firm—Fish & Richardson

[57] ABSTRACT

A clip for attaching a semiconductor to a heat sink comprises an arcuate section having a lip which contacts a projection on a heat sink so that the remainder of the arcuate section is disposed over the projection, the arcuate section also having a central stiffening rib. The clip further comprises a plate extending from the end of the arcuate section opposite its lip, the plate having sidewalls which form a semiconductor opening. When the clip is in place on the heat sink, the clip is flexed, and the plate is forced against a semiconductor, holding it in place against the heat sink.

7 Claims, 1 Drawing Sheet

HIGH FORCE CLIP

FIELD OF THE INVENTION

This invention relates to dissipation of heat from electronic semiconductor devices, and in particular, to the attachment of such semiconductors to heat sinks for that purpose.

BACKGROUND OF THE INVENTION

The use of semiconductors is limited in some respect to the heat sinks that must be used with them. Heat sinks must successfully expel and prevent heat build-up as the semiconductors operate, and to do so, the semiconductor must be firmly attached to the heat sink. However, the attachment means must be both readily removable in case the semiconductor has to be replaced and as compact as possible so as to take up little extra space when the heat sink is mounted to a circuit board.

One way of attaching a semiconductor to a heat sink having a projecting rail is by use of a screw assembly and lock washer. However, prior art torqued screw assemblies do not hold the semiconductor with the degree of force desired, and as a result, the semiconductors may slip or at the very least not produce good heat dissipation contact between the semiconductor and the heat sink. Another way involves the use of a resilient spring clip, but prior art clips also do not provide a high degree of holding force, and as a result, the prior art clips have the same drawbacks as the screw assemblies.

SUMMARY OF THE INVENTION

The present invention comprises a resilient spring clip for use in attaching a semiconductor to a heat sink having an attachment rail so that a high force is applied by the clip to the semiconductor whereby there is no slippage and good heat dissipation contact is maintained between the semiconductor and the heat sink. The clip of this invention also permits easy assembly and removal of the semiconductor to and from the heat sink.

In the preferred embodiment, the resilient clip of this invention is a unitary piece of metal with two principal portions. A first portion serves to secure the clip to the heat sink and comprises an arcuate spring section having a lip and a central stiffening rib. A second portion is a longitudinal plate with parallel sidewalls which form a semiconductor retaining portion. Force created in the arcuate spring section is applied to the plate, which presses on the semiconductor and holds it against the heat sink. At the same time, the sidewalls on the plate help position the semiconductor.

In operation, the clip is installed on an attachment rail of a heat sink so that the arcuate section contacts the heat sink on one side of the rail, opposite the semiconductor location. The plate is disposed on the other side of the rail and extends therefrom. The clip, which is flexed as it is installed, hooks onto the other side of the attachment rail, and it provides a positive force through the plate on the semiconductor, pressing it against the heat sink. When the semiconductor is positioned between the plate and the heat sink, the plate is raised from the heat sink surface. This action results in the spring section of the clip being flexed an additional amount so that an even larger force is then exerted by the plate on the semiconductor. The semiconductor is prevented from sideways motion by the restraining sidewalls on the plate.

The clip of this invention is simple and inexpensive to manufacture, and assembly to the heat sink is rapid and straightforward. Moreover, the clip exerts a large force on the semiconductor to keep it securely in position.

DESCRIPTION OF THE PREFERRED EMBODIMENTS

Figure 1:
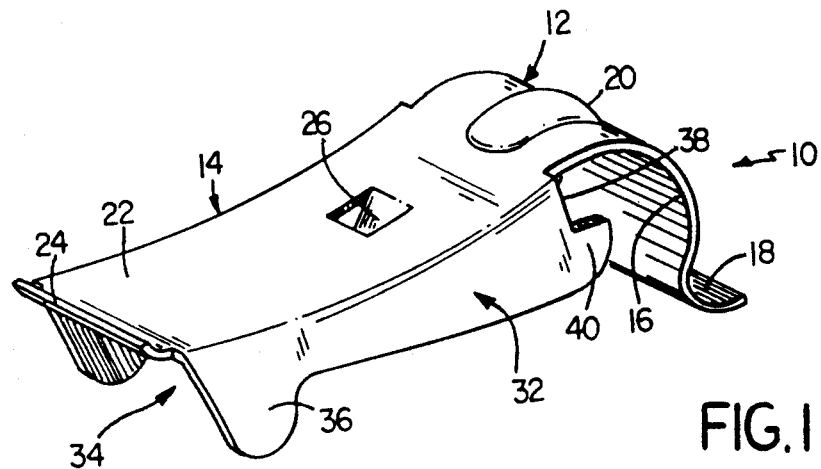
FIG. 1 is a perspective view of a retaining clip of the invention.
Figure 2:
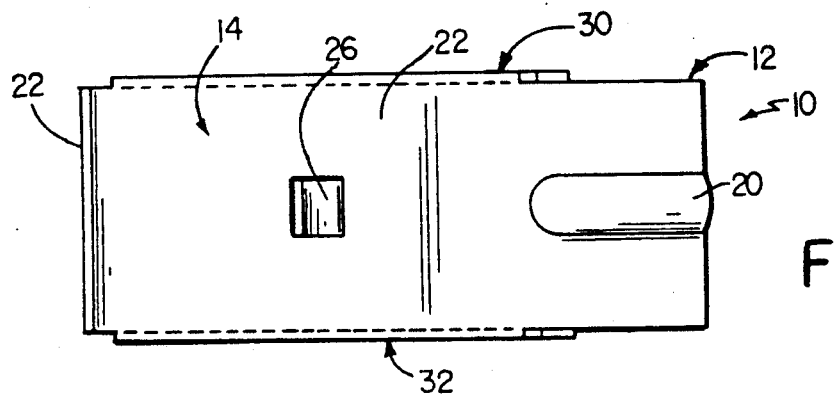
FIG. 2 is a top view of the clip of the invention.
Figure 3:
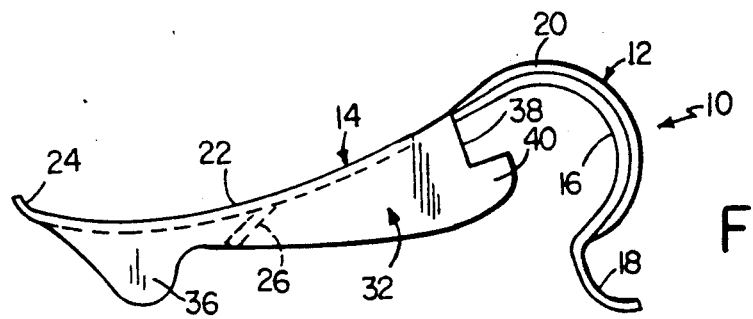
FIG. 3 is a side view of the clip of this invention.

With reference to FIGS. 1-3, a retaining clip according to the invention is shown at 10. Retaining clip 10 is unitary and made of metal and generally includes an arcuate spring portion 12 and a semiconductor contacting portion 14.

Arcuate spring portion 12 includes a curved arcuate section 16 ending at a curled lip 18. A longitudinal stiffening rib 20 is centrally disposed on the arcuate section 16, as best shown in FIG. 1.

Figure 4:
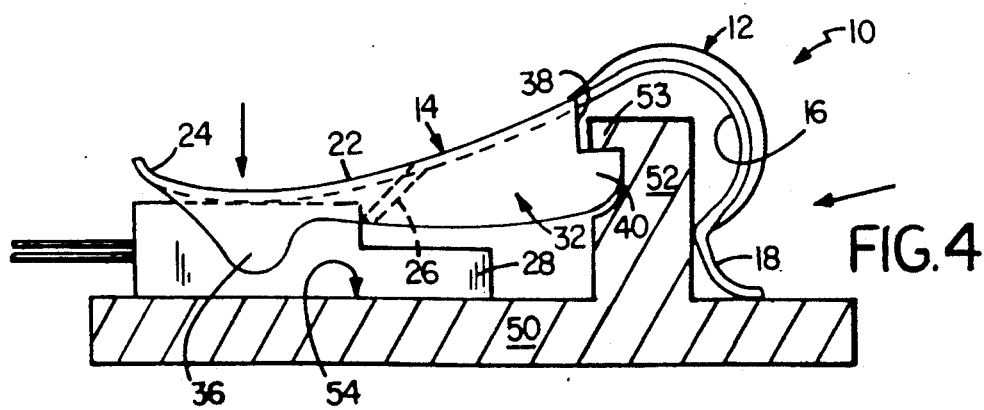
FIG. 4 is a side view of the clip of this invention mounted on a heat sink and holding a semiconductor in place.

The semiconductor contacting portion 14 comprises a main plate 22 having a gradual curve which is the reverse of that of the arcuate portion 12. The plate 22 has a curved lip 24 at its end opposite the arcuate section 16 and a centrally disposed tab 26 which projects below the plate 22 and which contacts a semiconductor 28 when the semiconductor is in position, as shown in FIG. 4. The plate 22 also has a pair of sidewalls 30, 32 extending its length and forming a semiconductor opening 34 therebetween. With reference to FIG. 1, sidewall 32 comprises, at one end adjacent to the lip 24 of the plate 22, a bulbous projection 36. At the opposite end of sidewall 32, which terminates at the end of the arcuate section 16 adjacent to the stiffening rib 20, there is a slot 38 bounded by a curved section 40. The other sidewall 30 is identical.

The operation of the clip 10 is best understood by referring to FIGS. 1 and 4. A heat sink 50 has an attachment rail 52 having a slot 53 on one side adjacent to a semiconductor contacting surface 54. The clip 10 is attached to the heat sink 50 by placing the arcuate section 16 over the rail 52 of the heat sink contacts one side of the rail 52 while the curved section 40 of the sidewall 32 (and that of sidewall 30 not shown), hooks into the slot 53 on the other side of the rail 52. The clip 10 is then secured in place. As shown in FIG. 4, the lip 18 at the end of the arcuate section 16 is disposed against the heat sink 50 and the rail 52 so that it exerts a force (shown by the arrow) against the rail 52, which force increases when the lip 24 of the plate 22 is moved away from the semiconductor surface 54 of the heat sink 50.

The reason is that the lip 18 presses against the rail 52 and translates such a movement into a flexing of the arcuate portion 12 which increases the distance between the lip 18 and the opposite end of the arcuate section 16. The stiffening rib 20 resists this flexure, thereby further increasing the force required to make it and the force applied by the clip 10 at the plate 22 once it is made. The rest of the arcuate section 16 extends over the rail 52, and the plate 22 of the semiconductor contacting portion 14 is disposed on the opposite side of the heat sink rail 52 so that the projection 36 of the sidewall 32 (and of its counterpart on sidewall 30) of the semiconductor containing portion 14 are forced towards the semiconductor surface 54 of the heat sink 50, as shown by the force arrow. When the clip 10 is first attached to the heat sink 50, the projections 36 are forced against the semiconductor surface 54. The force applied is much greater than with other clips because of the lip 18 and the rib 20.

The semiconductor 28 is attached either by installing the clip 10 over it or inserting the semiconductor 28 into the opening 34 after the clip 10 is attached. In the latter case, the lip 24 of the plate 22 of the semiconductor contacting portion 14 is lifted, so that the plate 22 moves away from the semiconductor contacting surface 54 of the heat sink 50. This may be accomplished with a metal blade (not shown). This action increases the flexure of the arcuate section 16 and the force it exerts on the plate 22 against the heat sink 50. The semiconductor 28 is then inserted in the semiconductor opening 34 between the surface 54 of the heat sink 50 and the plate 22 of the clip 10. When the lip 24 is released, the large restoring forces in arcuate section 16 force the plate 22 against the semiconductor, with tab 26 seating against the semiconductor so as to limit its movement in the direction of the rail 52. The sidewalls 30, 32 prevent the semiconductor 28 from slipping out from beneath the plate 22.

It should be appreciated that when assembled, the clip 10 does not project beyond the heat sink 50 so that the heat sink with the clip 10 and semiconductor 28 does not take up much more board space than the heat sink 50 and semiconductor 28 itself. Further, it should also be appreciated that the assembly of the clip and the heat sink does not require any special tools, and removal of a defective semiconductor is easily accomplished by lifting the lip 24.

Other embodiments will occur to those skilled in the art.

What is claimed is:

1. A resilient spring clip for attaching a semiconductor to a heat sink comprising:

a first portion adapted to connect said slip to the heat sink, said first portion comprising an arcuate spring section having a pair of lengthwise edges and a rib, said rib being disposed along at least a portion of the length of said arcuate section generally parallel to said edges, said arcuate section having a first end and a second end, said first end of said arcuate section adapted to contact a portion of the heat sink, a second portion adapted to hold a semiconductor, said second portion including a plate extending from said second end of said arcuate section and a pair of sidewalls which form a semiconductor opening therebetween, wherein when a semiconductor is placed in said semiconductor opening, said first end of said arcuate section and said rib act to resist flexure of said arcuate section so as to exert a force through said plate to hold the semiconductor to the heat sink.

2. The clip of claim 1 wherein each said sidewall of said second portion includes a curved section adjacent to said arcuate section, which said curved section is adapted to fit into a portion of the heat sink to hold said clip in place on the heat sink.

3. The clip of claim 2 wherein each said sidewall of said second portion includes a slot adjacent to each said curved section.

4. The clip of claim 1 wherein said rib is centrally disposed and projects from said arcuate portion.

5. The clip of claim 4 wherein said rib extends from said second end of said arcuate section to said first end of said arcuate section which comprises a lip.

6. The clip of claim 1 wherein said first end comprises a lip, said lip being adapted to contact a portion of the heat sink.

7. The clip of claim 1 wherein said plate comprises a lip at the end of said plate opposite said arcuate spring section, said lip of said plate being short and angled away from said semiconductor opening formed by said plate and said sidewalls.

* * * * *